United States Patent
Ueda et al.

(10) Patent No.: US 9,625,812 B2
(45) Date of Patent: Apr. 18, 2017

(54) PHOTOSENSITIVE RESIN COMPOSITION, PHOTOSENSITIVE DRY FILM, PATTERN FORMATION METHOD, PRINTED CIRCUIT BOARD, AND METHOD FOR PRODUCING SAME

(71) Applicant: MICRO PROCESS INC., Koshigaya-shi (JP)

(72) Inventors: Akifumi Ueda, Tsukuba (JP); Hidetaka Nakagawara, Otake (JP); Shintaro Okada, Toyohashi (JP); Saki Fujita, Toyohashi (JP); Kazuo Watanabe, Koshigaya (JP); Shigeki Watanabe, Tokyo (JP)

(73) Assignee: MICRO PROCESS INC., Koshigaya-shi (JP)

( * ) Notice: Subject to any disclaimer, the term of this patent is extended or adjusted under 35 U.S.C. 154(b) by 113 days.

(21) Appl. No.: 14/413,557

(22) PCT Filed: Jul. 2, 2013

(86) PCT No.: PCT/JP2013/068165
§ 371 (c)(1),
(2) Date: Jan. 8, 2015

(87) PCT Pub. No.: WO2014/010473
PCT Pub. Date: Jan. 16, 2014

(65) Prior Publication Data
US 2015/0168832 A1    Jun. 18, 2015

(30) Foreign Application Priority Data

Jul. 10, 2012  (JP) ................................. 2012-154959

(51) Int. Cl.

| | | |
|---|---|---|
| G03F 7/038 | (2006.01) | |
| G03F 7/023 | (2006.01) | |
| G03F 7/022 | (2006.01) | |
| G03F 7/30 | (2006.01) | |
| G03F 7/32 | (2006.01) | |
| G03F 7/40 | (2006.01) | |
| H05K 3/06 | (2006.01) | |
| H05K 3/18 | (2006.01) | |
| C08F 212/14 | (2006.01) | |
| C08F 220/18 | (2006.01) | |

(52) U.S. Cl.
CPC ............ *G03F 7/038* (2013.01); *C08F 212/14* (2013.01); *C08F 220/18* (2013.01); *G03F 7/0226* (2013.01); *G03F 7/0233* (2013.01); *G03F 7/0388* (2013.01); *G03F 7/30* (2013.01); *G03F 7/322* (2013.01); *G03F 7/40* (2013.01); *G03F 7/405* (2013.01); *H05K 3/064* (2013.01); *H05K 3/184* (2013.01)

(58) Field of Classification Search
None
See application file for complete search history.

(56) References Cited

U.S. PATENT DOCUMENTS

| | | | |
|---|---|---|---|
| 2003/0059706 A1* | 3/2003 | Misumi et al. ............... | 430/190 |
| 2011/0081616 A1* | 4/2011 | Ajioka ..................... | C08F 2/50 |
| | | | 430/319 |
| 2013/0004895 A1 | 1/2013 | Ueda et al. | |

FOREIGN PATENT DOCUMENTS

| | | |
|---|---|---|
| JP | 1-280748 | 11/1989 |
| JP | 7-133449 | 5/1995 |
| JP | 8-211600 A | 8/1996 |
| JP | 2004-117882 | 4/2004 |
| JP | 2005-189810 A | 7/2005 |
| JP | 2006-154434 A | 6/2006 |
| JP | 2010-15079 A | 1/2010 |
| JP | 2010-49227 A | 3/2010 |
| JP | 2011-238589 A | 11/2011 |
| JP | 2012-8425 A | 1/2012 |
| KR | 10-2008-0049141 A | 6/2008 |
| WO | 2011/081131 A1 | 7/2011 |
| WO | WO 2011/081127 A1 | 7/2011 |

OTHER PUBLICATIONS

Office Action issued May 20, 2015 in Korean Patent Application No. 10-2015-7000424 (with English language translation).
Notice of Allowance issued Feb. 24, 2015 in Japanese Patent Application No. 2013-531999 (with English language translation).
International Search Report and Written Opinion of the International Searching Authority issued Jul. 30, 2013, in PCT/JP2013/068165, filed Jul. 2, 2013.

* cited by examiner

*Primary Examiner* — Sin Lee
(74) *Attorney, Agent, or Firm* — Oblon, McClelland, Maier & Neustadt, L.L.P.

(57) ABSTRACT

The photosensitive resin composition of the present invention contains a vinyl-based (co)polymer (I) obtained by polymerizing a monomer mixture (α) containing a vinyl-based monomer (a) having a phenolic hydroxyl group, a vinyl-based copolymer (II) having a weight-average molecular weight of 15,000 to 120,000, obtained by polymerizing a monomer mixture (β) containing a vinyl-based monomer (b) represented by $CH_2=CR^1COO(R^2O)_kR^3$ (wherein $R^1$=a hydrogen atom or a methyl group, $R^2$=a hydrocarbon group having a carbon number of 1 to 4, $R^3$=a hydrogen atom or a methyl group, and k=1 to 90) and a carboxyl group-containing vinyl-based monomer (c), a photosensitive substance (III), and a compound (IV) which is a specific aromatic polyhydroxy compound.

9 Claims, No Drawings

PHOTOSENSITIVE RESIN COMPOSITION, PHOTOSENSITIVE DRY FILM, PATTERN FORMATION METHOD, PRINTED CIRCUIT BOARD, AND METHOD FOR PRODUCING SAME

TECHNICAL FIELD

The present invention relates to a photosensitive resin composition, a photosensitive dry film, a pattern formation method using this composition or dry film, a printed circuit board, and a method for producing the same.

Priority is claimed on Japanese Patent Application No. 2012-154959, filed Jul. 10, 2012, the content of which is incorporated herein by reference.

BACKGROUND ART

Processes using photosensitive resin compositions are widely used as processes for forming electronic circuits and the like.

In a circuit formation process using a photosensitive resin composition, an electronic circuit is formed by conducting a step of forming a resist film composed of the photosensitive resin composition on the surface of a substrate, a step of forming a latent image by irradiating the resist film with light through a mask, a step of forming a resist pattern by subjecting the resist film with the latent image formed thereon to a developing treatment with a developing solution, and a step of chemically etching or plating the portions from which the resist has been removed.

Further, miniaturization of electronic circuits is being investigated in the fields of chip-on-film (COF) in which a bare chip is mounted directly on a flexible substrate, multilayer printed circuit boards formed by the build-up method, and lead-out wiring which is used in touch panel sensor circuits and tablet terminals and the like. Negative dry film resists have been widely used in circuit formation processes, but many technical problems exist in terms of meeting the current demands for further miniaturization.

On the other hand, positive photosensitive resin compositions are suitable for miniaturization, and hold much hope as materials capable of meeting ongoing demands for miniaturization. However, they lack flexibility and suffer from many problems during circuit formation on flexible substrates and dry film formation.

Examples of currently known positive photosensitive resin compositions include the compositions described below.

(1) A photosensitive resin composition containing a vinyl-based polymer (I) obtained by polymerizing a monomer mixture containing a vinyl-based monomer having a phenolic hydroxyl group, a vinyl-based polymer (II) obtained by polymerizing a monomer mixture containing a carboxyl group-containing vinyl-based monomer, a quinonediazide compound, and an aromatic polyhydroxy compound (see Patent Document 1).

(2) A positive photosensitive composition containing an o-quinonediazide compound, an alkali-soluble resin, and a specific bisphenol carboxylic acid derivative (see Patent Document 2).

However, in the photosensitive resin composition of (1), the vinyl-based polymer (I) is rigid and lacks flexibility, and also exhibits poor solubility in developing solutions, and therefore when the photosensitive resin composition of (1) is used as a resist film, the combination of cracking resistance and resolution for the resist film is not entirely satisfactory. When the photosensitive resin composition of (1) is converted to a dry film, because the dry film is wound, the above problems become particularly obvious.

In the positive photosensitive composition of (2), the alkali-soluble resin is rigid and lacks flexibility, and also exhibits poor solubility in developing solutions, and therefore when the photosensitive resin composition of (2) is used as a resist film, the combination of cracking resistance and resolution for the resist film is not entirely satisfactory. Further, Patent Document 2 makes no mention of the formation of dry films.

DOCUMENTS OF RELATED ART

Patent Documents

Patent Document 1: International Patent Publication No. 2011/081131

Patent Document 2: Japanese Unexamined Patent Application, First Publication No. Hei 1-280748

SUMMARY OF THE INVENTION

Problems to be Solved by the Invention

The objects of the present invention are to provide a positive photosensitive resin composition which can form a resist film that is resistant to cracking and exhibits excellent resolution in the circuit formation process for a COF, a multilayer printed circuit board formed by the build-up method, or lead-out wiring used in a touch panel sensor circuit or tablet terminal or the like, and also to provide a positive photosensitive dry film, a pattern formation method that uses the positive photosensitive resin composition or the positive photosensitive dry film, a printed circuit board, and a method for producing the printed circuit board.

Means to Solve the Problems

<1> One aspect of the photosensitive resin composition of the present invention includes a vinyl-based (co)polymer (I) obtained by polymerizing a monomer mixture (α) containing a vinyl-based monomer (a) having a phenolic hydroxyl group, a vinyl-based copolymer (II) (excluding the vinyl-based (co)polymer (I)) having a weight-average molecular weight of 15,000 to 120,000, obtained by polymerizing a monomer mixture (β) containing a vinyl-based monomer (b) represented by formula (1) shown below and a carboxyl group-containing vinyl-based monomer (c), a photosensitive substance (III), and a compound (IV) represented by formula (2) shown below.

[Chemical Formula 1]

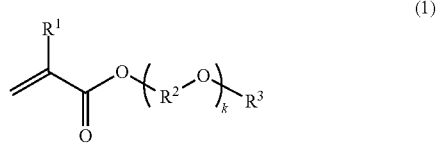

(1)

In formula (1), $R^1$ represents a hydrogen atom or a methyl group, $R^2$ represents a hydrocarbon group having a carbon number of 1 to 4, $R^3$ represents a hydrogen atom or a methyl group, and k represents an integer of 1 to 90.

[Chemical Formula 2]

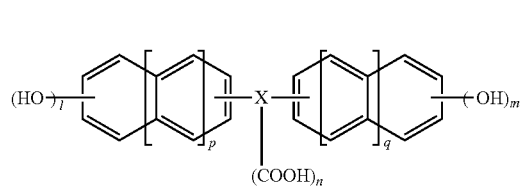

(2)

In formula (2), X represents a hydrocarbon group having a carbon number of 1 to 6, each of l and m represents an integer of 1 to 3, n represents 1 or 2, and each of p and q represents 0 or 1.

<2> The photosensitive resin composition of <1>, wherein the monomer (b) is 2-methoxyethyl acrylate.

<3> The photosensitive resin composition of <1> or <2>, wherein the proportion of the monomer (b) in the monomer mixture (β) is from 5 to 30 mol %.

<4> The photosensitive resin composition of any one of <1> to <3>, wherein the photosensitive substance (III) is a quinonediazide compound.

<5> The photosensitive resin composition of <4>, wherein the quinonediazide compound is an ester of an aromatic polyhydroxy compound having 1 to 3 aromatic rings, and 1,2-naphthoquinonediazide-5-sulfonic acid and/or 1,2-naphthoquinonediazide-4-sulfonic acid.

<6> The photosensitive resin composition of <5>, wherein the quinonediazide compound is an ester of the compound represented by formula (3) shown below, the compound represented by formula (4) shown below or the compound represented by formula (5) shown below, and 1,2-naphthoquinonediazide-5-sulfonic acid and/or 1,2-naphthoquinonediazide-4-sulfonic acid.

[Chemical Formula 3]

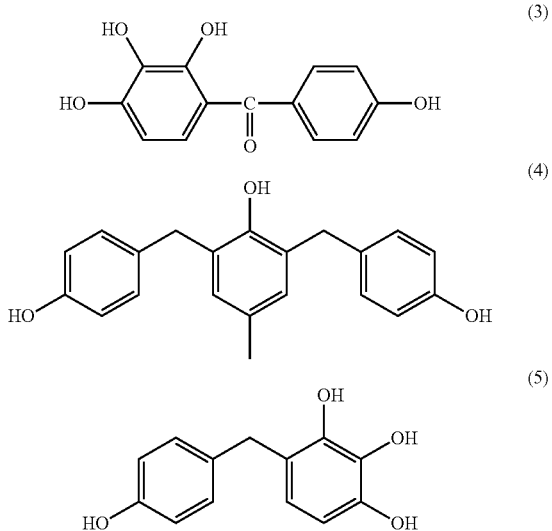

(3)

(4)

(5)

<7> The photosensitive resin composition of any one of <1> to <6>, wherein the compound (IV) is the compound represented by formula (2-1) shown below or the compound represented by formula (2-2) shown below.

[Chemical Formula 4]

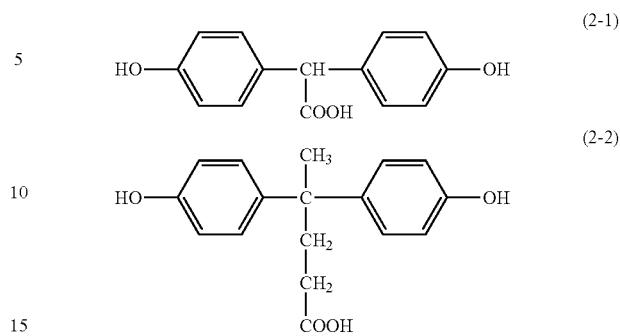

(2-1)

(2-2)

<8> The photosensitive resin composition of any one of <1> to <7>, wherein the vinyl-based (co)polymer (I) is a copolymer obtained by polymerizing a monomer mixture (a) containing the monomer (a) and the monomer (c).

<9> One aspect of the photosensitive dry film of the present invention includes a resist film formed from the photosensitive resin composition of any one of <1> to <8> formed on the surface of a support film.

<10> One aspect of the pattern formation method of the present invention includes a step of forming a resist film composed of the photosensitive resin composition of any one of <1> to <8> on the surface of a substrate, a step of forming a latent image by exposing the resist film, and a step of forming a resist pattern by subjecting the resist film with the latent image formed thereon to a developing treatment with an alkaline developing solution.

<11> One aspect of the printed circuit board of the present invention is produced using the photosensitive resin composition of any one of <1> to <8>.

<12> One aspect of the method for producing a printed circuit board of the present invention is a method which uses the photosensitive resin composition of any one of <1> to <8>.

Effects of the Invention

The photosensitive resin composition of the present invention can form a resist film that is resistant to cracking and exhibits excellent resolution in a circuit formation process for a COF, a multilayer printed circuit board formed by the build-up method, or lead-out wiring used in a touch panel sensor circuit or tablet terminal or the like.

The photosensitive dry film of the present invention can form a resist film that is resistant to cracking and exhibits excellent resolution in a circuit formation process for a COF, a multilayer printed circuit board formed by the build-up method, or lead-out wiring used in a touch panel sensor circuit or tablet terminal or the like.

The pattern formation method of the present invention can form a high-precision, very fine pattern with minimal defects in a circuit formation process for a COF, a multilayer printed circuit board formed by the build-up method, or lead-out wiring used in a touch panel sensor circuit or tablet terminal or the like.

The printed circuit board of the present invention can be applied to a COF, a multilayer printed circuit board formed by the build-up method, or lead-out wiring used in a touch panel sensor circuit or tablet terminal or the like.

The method for producing a printed circuit board of the present invention can be used to achieve miniaturization of the electronic circuits in a COF, a multilayer printed circuit board formed by the build-up method, or lead-out wiring used in a touch panel sensor circuit or tablet terminal or the like.

EMBODIMENTS FOR CARRYING OUT THE INVENTION

The following definitions of terms apply throughout the description of the present invention and the claims.

"(Meth)acrylic acid" means acrylic acid or methacrylic acid.

"(Meth)acryloyl" means acryloyl or methacryloyl.

A "monomer" means a compound having a polymerizable carbon-carbon double bond.

A "(co)polymer" means a homopolymer or a copolymer.

<Photosensitive Resin Composition>

A photosensitive resin composition of the present invention includes a vinyl-based (co)polymer (I), a vinyl-based copolymer (II), a photosensitive substance (III) and a compound (IV), and may also include other components as required.

(Vinyl-Based (Co)Polymer (I))

The vinyl-based (co)polymer (I) is a polymer obtained by polymerizing a monomer mixture (α) containing a vinyl-based monomer (a) having a phenolic hydroxyl group (hereafter also referred to as simply "monomer (a)"), and if necessary, may be a polymer obtained by polymerizing a monomer mixture (α) which also contains a carboxyl group-containing vinyl-based monomer (c) (hereafter also referred to as simply "monomer (c)").

The monomer (a) has one or more aromatic rings, and at least one of the hydrogen atoms of the aromatic ring(s) is substituted with a hydroxyl group.

The monomer (a) is preferably a monomer (a1) represented by formula (6) shown below, a monomer (a2) represented by formula (7) shown below, or a monomer (a3) represented by formula (8) shown below.

[Chemical Formula 5]

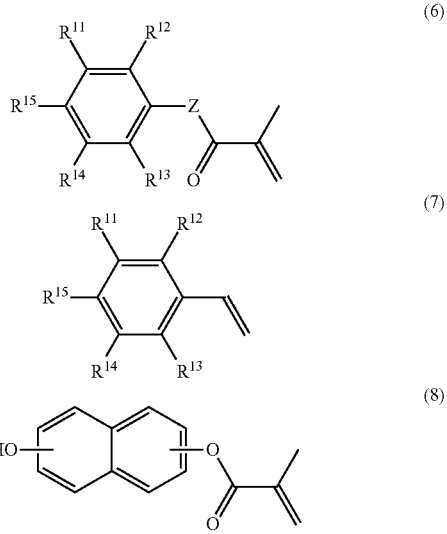

Each of $R^{11}$ to $R^{15}$ independently represents a hydrogen atom, a hydroxyl group, an alkyl group having a carbon number of 1 to 24, an aryl group having a carbon number of 1 to 24 or an aralkyl group having a carbon number of 1 to 24, provided that at least one of $R^{11}$ to $R^{15}$ represents a hydroxyl group. Each of the groups $R^{11}$ to $R^{15}$ that is not a hydroxyl group is preferably a hydrogen atom or an alkyl group having a carbon number of 1 to 24, and from the viewpoint of ease of availability of the monomer (a) is more preferably a hydrogen atom.

Z represents an oxygen atom or NH.

From the viewpoint of ease of availability, the monomer (a1) is preferably a monomer (a1-1) represented by formula (6-1) shown below, or a monomer (a1-2) represented by formula (6-2) shown below.

From the viewpoint of ease of availability, the monomer (a2) is preferably a monomer (a2-1) represented by formula (7-1) shown below.

From the viewpoint of ease of availability, the monomer (a3) is preferably a monomer (a3-1) represented by formula (8-1) shown below.

[Chemical Formula 6]

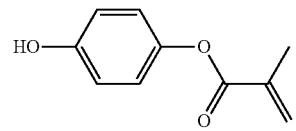

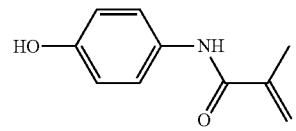

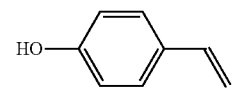

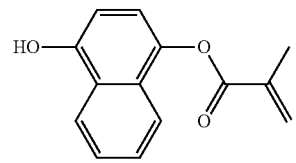

The proportion of the monomer (a) in the monomer mixture (α), relative to a value of 100 mol % for the combined total of all the monomers, is preferably from 5 to 100 mol %, more preferably from 10 to 95 mol %, still more preferably from 20 to 90 mol %, and most preferably from 30 to 80 mol %. Provided that the proportion of the monomer (a) is at least 5 mol %, the resolution of the resist film is satisfactorily high, and thickness loss of the unexposed portions of the resist film can be adequately suppressed. In terms of improving the resolution, the proportion is preferably not more than 90 mol %.

The monomer (c) can be used as required to improve the resolution.

Examples of the monomer (c) include (meth)acrylic acid, itaconic acid, itaconic acid monoesters, fumaric acid, fumaric acid monoesters, maleic acid, maleic acid monoesters, 2-(meth)acryloyloxyethyl phthalic acid, and 2-(meth)acryloyloxyethyl hexahydrophthalic acid.

The proportion of the monomer (c) in the monomer mixture (α), relative to a value of 100 mol % for the combined total of all the monomers, is preferably from 0 to 30 mol %, more preferably from 5 to 30 mol %, and still more preferably from 10 to 30 mol %. Provided that the proportion of the monomer (c) is at least 5 mol %, the resolution of the resist film can be increased satisfactorily. Provided that the proportion of the monomer (c) is not more than 30 mol %, thickness loss of the unexposed portions of the resist film can be adequately suppressed, and cracking of the resist film can also be adequately suppressed.

If necessary, the monomer mixture (α) may also include one or more other vinyl-based monomers that are copolymerizable with the monomer (a) and the monomer (c). Examples of these types of vinyl-based monomers include acrylate esters such as ethyl acrylate, methacrylate esters such as methyl methacrylate, and styrene-based monomers such as styrene.

The proportion of other vinyl-based monomers in the monomer mixture (α), relative to a value of 100 mol % for the combined total of all the monomers, represents the residual proportion excluding the monomer (a) and the monomer (c).

The weight-average molecular weight of the vinyl-based (co)polymer (I) is not particularly limited, but is preferably from 5,000 to 80,000, more preferably from 6,000 to 30,000, and most preferably from 7,000 to 15,000. Provided that the weight-average molecular weight is not more than 80,000, satisfactory resolution can be achieved. Provided that the weight-average molecular weight is at least 5,000, the durability of the resist film can be maintained.

The weight-average molecular weight of the vinyl-based (co)polymer (I) refers to the polystyrene-equivalent weight-average molecular weight measured by gel permeation chromatography (GPC).

(Vinyl-Based Copolymer (II))

The vinyl-based copolymer (II) is a polymer having a weight-average molecular weight of 15,000 to 120,000, obtained by polymerizing a monomer mixture (β) containing a vinyl-based monomer (b) represented by formula (1) shown below (hereafter also referred to as simply "monomer (b)") and the monomer (c).

[Chemical Formula 7]

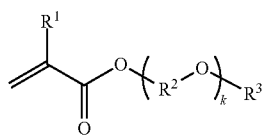

(1)

$R^1$ represents a hydrogen atom or a methyl group, $R^2$ represents a hydrocarbon group having a carbon number of 1 to 4, $R^3$ represents a hydrogen atom or a methyl group, and k represents an integer of 1 to 90.

Examples of the monomer (b) include 2-methoxyethyl acrylate, 2-hydroxyethyl acrylate, 2-hydroxyethyl methacrylate, methoxymethyl acrylate, methoxymethyl methacrylate, polyethylene glycol methacrylate (in which the number of repeating units in the polyethylene glycol (k in formula (1)) is from 1 to 90), polypropylene glycol methacrylate (in which the number of repeating units in the polypropylene glycol (k in formula (1)) is from 1 to 90), polyethylene glycol acrylate (in which the number of repeating units in the polyethylene glycol (k in formula (1)) is from 1 to 90), polypropylene glycol acrylate (in which the number of repeating units in the polypropylene glycol (k in formula (1)) is from 1 to 90), methoxypolyethylene glycol methacrylate (in which the number of repeating units in the polyethylene glycol (k in formula (1)) is from 1 to 90), and methoxypolyethylene glycol acrylate (in which the number of repeating units in the polyethylene glycol (k in formula (1)) is from 1 to 90). Among these, in terms of the compatibility and polymerizability with the vinyl-based (co)polymer (1), compounds of the general formula (1) in which $R^3$ represents a methyl group and k represents 1, or compounds in which $R^3$ represents a hydrogen atom or a methyl group and k represents an integer of 2 to 90 are preferable, compounds in which $R^3$ represents a methyl group and k represents 1 are more preferable, and a compound in which $R^1$ represents a hydrogen atom, $R^2$ represents an ethyl group, $R^3$ represents a methyl group and k represents 1, namely 2-methoxyethyl acrylate, is the most desirable.

The proportion of the monomer (b) in the monomer mixture (β), relative to a value of 100 mol % for the combined total of all the monomers, is preferably from 5 to 30 mol %, more preferably from 7 to 20 mol %, and still more preferably from 9 to 15 mol %. Provided that the proportion of the monomer (b) is at least 5 mol %, adequate flexibility can be imparted to the resist film. Provided that the proportion of the monomer (b) is not more than 30 mol %, the amount of thickness loss during developing can be suppressed.

The monomer (c) is used to improve the resolution.

Examples of the monomer (c) include the same compounds as those mentioned above in relation to the aforementioned vinyl-based (co)polymer (I).

The proportion of the monomer (c) in the monomer mixture (β), relative to a value of 100 mol % for the combined total of all the monomers, is preferably from 3 to 30 mol %, more preferably from 5 to 30 mol %, and still more preferably from 10 to 30 mol %. Provided that the proportion of the monomer (c) is at least 5 mol %, the resolution of the resist film can be increased satisfactorily. Provided that the proportion of the monomer (c) is not more than 30 mol %, thickness loss of the unexposed portions of the resist film can be adequately suppressed, and cracking of the resist film can also be adequately suppressed.

If necessary, the monomer mixture (β) may also include one or more other vinyl-based monomers that are copolymerizable with the monomer (b) and the monomer (c). However, the monomer mixture (β) does not contain the monomer (a). Examples of these types of other vinyl-based monomers include acrylate esters such as ethyl acrylate and 2-ethylhexyl acrylate, methacrylate esters such as methyl methacrylate, and styrene-based monomers such as styrene.

The proportion of other vinyl-based monomers in the monomer mixture (β), relative to a value of 100 mol % for the combined total of all the monomers, represents the residual proportion excluding the monomer (b) and the monomer (c).

The weight-average molecular weight of the vinyl-based (co)polymer (II) is from 15,000 to 120,000, and is preferably from 20,000 to 100,000, and more preferably from 40,000 to 80,000. Provided that the weight-average molecular weight is at least 15,000, the etching resistance and plating resistance of the resist film can be enhanced satisfactorily. Provided that the weight-average molecular weight is not more than 120,000, favorable compatibility with the other components is achieved upon forming a resist solution, and favorable developing properties can also be achieved.

The weight-average molecular weight of the vinyl-based (co)polymer (II) refers to the polystyrene-equivalent weight-average molecular weight measured by GPC.

(Production of Polymers)

The vinyl-based (co)polymer (I) and the vinyl-based copolymer (II) can be produced using conventional polymerization methods such as solution polymerization methods, suspension polymerization methods or emulsion polymerization methods. In terms of minimizing the incorporation of impurities such as emulsifiers, a solution polymerization method or suspension polymerization method is preferred.

For example, the vinyl-based (co)polymer (I) and the vinyl-based copolymer (II) can be obtained by polymerizing the monomer mixture by a conventional radical polymerization method, such as a solution polymerization method in which a monomer mixture having a radical polymerization initiator such as azobisisobutyronitrile (AIBN) mixed and dissolved therein is added dropwise over several hours to an organic solvent heated to a temperature of about 60 to 120° C. in a polymerization vessel, thus causing the polymerization to proceed. The monomers may be mixed together and the resulting mixture supplied to the polymerization vessel to effect the polymerization, each of the monomers may be supplied separately to the polymerization vessel, or a mixture of two of the monomers and another individual monomer may be supplied separately to the polymerization vessel.

(Ratio of Polymers)

Within 100 parts by mass of the combined total of the vinyl-based (co)polymer (I) and the vinyl-based copolymer (II), the respective amounts of the vinyl-based (co)polymer (I) and the vinyl-based copolymer (II) (the mass ratio) is preferably from 20/80 to 95/5, and more preferably from 50/50 to 90/10. Provided that the amount of the vinyl-based (co)polymer (I) is at least 20% by mass and the amount of the vinyl-based copolymer (II) is not more than 80% by mass, thickness loss of the unexposed portions can be adequately suppressed without impairing the sensitivity or resolution of the resist film. Provided that the amount of the vinyl-based (co)polymer (I) is not more than 95% by mass and the amount of the vinyl-based copolymer (II) is at least 5% by mass, cracking of the resist film can be satisfactorily suppressed.

(Photosensitive Substance (III))

Examples of the photosensitive substance (III) include conventional 1,2-quinonediazide-4-sulfonic acid ester compounds, 1,2-quinonediazide-5-sulfonic acid ester compounds, 1,2-quinonediazide-6-sulfonic acid ester compounds, 1,2-quinonediazide-7-sulfonic acid ester compounds, 1,2-quinonediazide-8-sulfonic acid ester compounds, bisazide compounds, diazodisulfone-based compounds, triphenylsulfonium-based compounds, and iodonium-based compounds. Specific examples include 1,2-naphthoquinonediazidesulfonic acid esters of trihydroxybenzophenone, 1,2-naphthoquinonediazidesulfonic acid esters of tetrahydroxybenzophenone, 1,2-naphthoquinonediazidesulfonic acid esters of pentahydroxybenzophenone, 1,2-naphthoquinonediazidesulfonic acid esters of hexahydroxybenzophenone, and 1,2-naphthoquinonediazidesulfonic acid esters of (polyhydroxy)alkanes.

The photosensitive substance (III) is preferably a quinonediazide compound, and in terms of the sensitivity and resolution of the resist film, is preferably an ester of an aromatic polyhydroxy compound having 1 to 3 aromatic rings, and at least one compound selected from the group consisting of 1,2-naphthoquinonediazide-5-sulfonic acid and 1,2-naphthoquinonediazide-4-sulfonic acid, and is particularly preferably an ester of the compound represented by formula (3) shown below, the compound represented by formula (4) shown below or the compound represented by formula (5) shown below, and at least one compound selected from the group consisting of 1,2-naphthoquinonediazide-5-sulfonic acid and 1,2-naphthoquinonediazide-4-sulfonic acid.

[Chemical Formula 8]

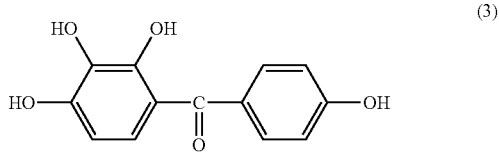

(3)

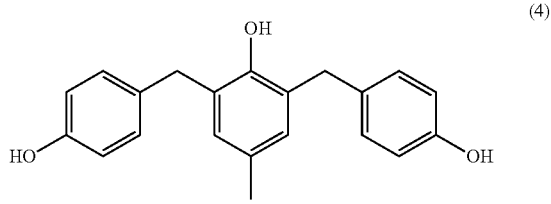

(4)

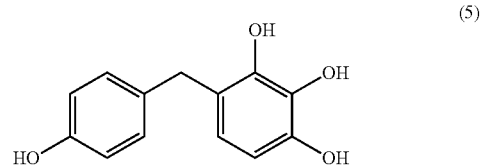

(5)

The amount of the photosensitive substance (III), relative to 100 parts by mass of the combined total of the vinyl-based (co)polymer (I) and the vinyl-based copolymer (II), is preferably from 5 to 70 parts by mass, more preferably from 5 to 60 parts by mass, and still more preferably from 5 to 15 parts by mass. Provided that the amount of the photosensitive substance (III) is at least 5 parts by mass, cracking of the resist film can be adequately suppressed. Provided that the amount of the photosensitive substance (III) is not more than 70 parts by mass, the resolution of the resist film can be increased satisfactorily.

(Compound (IV))

The compound (IV) is a compound represented by formula (2) shown below, and is a component which improves the alkali solubility rate of the resist film, and can therefore improve the resolution of the resist film.

[Chemical Formula 9]

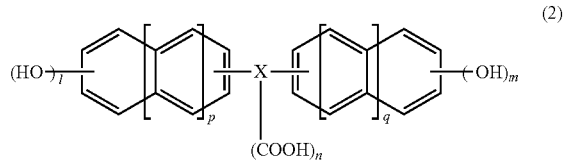

(2)

X represents a non-cyclic hydrocarbon group having a carbon number of 1 to 6, and from the viewpoint of the resolution of the resist film, is preferably an alkanetriyl group having a carbon number of 1 to 3.

Each of l and m represents an integer of 1 to 3, and in terms of the resolution of the resist film, is preferably 1 or 2.

Further, n represents 1 or 2, and in terms of the resolution of the resist film, is preferably 1.

Each of p and q represents 0 or 1, and in terms of the resolution of the resist film, is preferably 0.

The compound (IV) can be produced, for example, using the method described below.

A compound represented by formula (2-a) shown below (in the formula, l and p have the same meanings as defined above) and phosphorus oxychloride are reacted (Vilsmeier reaction) in an amide (for example, N,N-dimethylformamide or the like). Next, sodium cyanide is reacted with the obtained reaction mixture, and the resulting reaction mixture is hydrolyzed in the presence of an acid or an alkali to obtain a compound represented by formula (2-b) shown below (in the formula, l, n, p and X have the same meanings as defined above). Subsequently, this compound and a compound represented by formula (2-c) shown below (in the formula, m and q have the same meanings as defined above) are condensed in the presence of an acidic catalyst (for example, hydrochloric acid or the like). As a result, the compound (IV) is obtained.

[Chemical Formula 10]

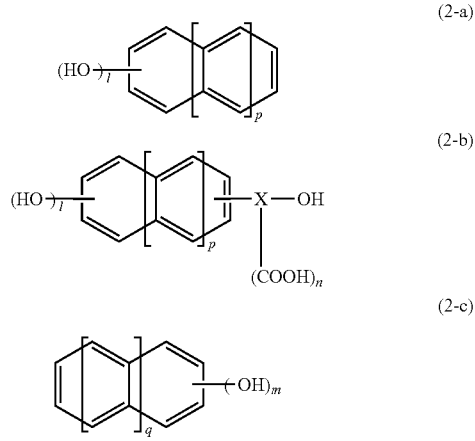

From the viewpoint of the resolution of the resist film, a compound represented by formula (2-1) shown below or a compound represented by formula (2-2) shown below is particularly preferable as the compound (IV).

[Chemical Formula 11]

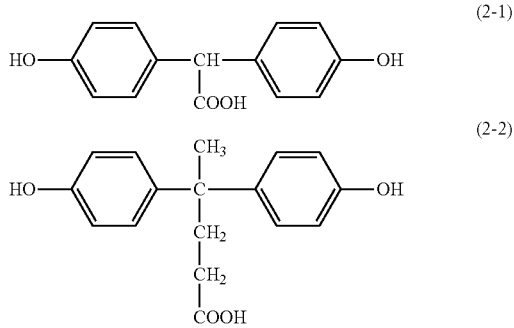

The amount of the compound (IV), relative to 100 parts by mass of the combined total of the vinyl-based (co)polymer (I) and the vinyl-based copolymer (II), is preferably from 0.5 to 10 parts by mass, more preferably from 1 to 8 parts by mass, and still more preferably from 2 to 6 parts by mass. Provided that the amount of the compound (IV) is at least 0.5 parts by mass, the alkali solubility rate of the resist film can be increased satisfactorily. Provided that the amount of the compound (IV) is not more than 10 parts by mass, thickness loss of the unexposed portions of the resist film can be adequately suppressed.

(Other Components)

Examples of other components include alkali-soluble resins other than the vinyl-based (co)polymer (I) and the vinyl-based copolymer (II), leveling agents, storage stabilizers, plasticizers, light absorbers, crosslinking agents and adhesion assistants.

Examples of other alkali-soluble resins include poly(meth)acrylic acid and copolymers of (meth)acrylic acid and a (meth)acrylate ester.

The amount of these other components is preferably from 0 to 30% by mass within 100% by mass of the solid fraction of the photosensitive resin composition.

(Dry Film)

The photosensitive resin composition of the present invention is typically used in the form of a dry film.

The dry film is produced, for example, by applying a resist solution described below to the surface of a support film, and then drying the resist solution to form a resist film.

In order to ensure practical utility as a dry film, the thickness of the resist film is preferably at least 3 μm.

Examples of the material of the support film include polyethylene terephthalate (hereafter abbreviated as PET), aromatic polyamide, polyimide, polymethylpentene, polyethylene and polypropylene. In terms of the cost and the properties of the dry film, PET is preferable.

(Resist Solution)

The photosensitive resin composition of the present invention may be used in the form of a resist solution obtained by dissolving the composition in a solvent. The resist solution is prepared, for example, by a method in which the vinyl-based (co)polymer (I), the vinyl-based copolymer (II), the photosensitive substance (III), the compound (IV) and a solvent are mixed together; or by a method in which the photosensitive substance (III) and the compound (IV) are added to a solution containing the vinyl-based (co)polymer (I) and the vinyl-based copolymer (II) obtained by a suspension polymerization method or a solution polymerization method.

Examples of the solvent include the compounds listed below.

Examples of ketones include linear or branched ketones such as acetone, methyl ethyl ketone (hereafter abbreviated as MEK), methyl isobutyl ketone, 2-pentanone and 2-hexanone; and cyclic ketones such as cyclopentanone and cyclohexanone.

Examples of propylene glycol monoalkyl acetates include propylene glycol monomethyl ether acetate (hereafter abbreviated as PGMEA) and propylene glycol monoethyl ether acetate.

Examples of ethylene glycol monoalkyl ether acetates include ethylene glycol monomethyl ether acetate and ethylene glycol monoethyl ether acetate.

Examples of propylene glycol monoalkyl ethers include propylene glycol monomethyl ether and propylene glycol monoethyl ether.

Examples of ethylene glycol monoalkyl ethers include ethylene glycol monomethyl ether and ethylene glycol monoethyl ether.

Examples of diethylene glycol alkyl ethers include diethylene glycol dimethyl ether and diethylene glycol monomethyl ether.

Examples of esters include ethyl acetate and ethyl lactate.

Examples of alcohols include methyl alcohol, ethyl alcohol, n-propyl alcohol, isopropyl alcohol, n-butyl alcohol, cyclohexanol and 1-octanol.

Examples of aliphatic hydrocarbon-based solvents having a carbon number of 5 to 11 include pentane, 2-methylbutane, n-hexane, 2-methylpentane, 2,2-dibutylbutane, 2,3-dibutylbutane, n-heptane, n-octane, isooctane, 2,2,3-trimethylpentane, n-nonane, 2,2,5-trimethylhexane, n-decane and n-dodecane.

Examples of other compounds include 1,4-dioxane, ethylene carbonate and γ-butyrolactone.

A single type of solvent may be used alone, or two or more types of solvents may be combined.

From the viewpoints of safety and general availability, the solvent is preferably acetone, methyl alcohol, ethyl alcohol, isopropyl alcohol, MEK, PGMEA, ethyl lactate, cyclohexanone or γ-butyrolactone or the like.

In terms of the viscosity of the resist solution, the solid fraction concentration of the resist solution is preferably not more than 50% by mass, more preferably 40% by mass or less, and still more preferably 35% by mass or less. In terms of the productivity of the vinyl-based (co)polymer (I) and the vinyl-based copolymer (II), the solid fraction concentration of the resist solution is preferably at least 2% by mass, more preferably at least 5% by mass, and still more preferably 8% by mass or greater.

(Actions and Effects)

The photosensitive resin composition of the present invention described above contains the specified vinyl-based (co)polymer (I) and the specified vinyl-based copolymer (II), and can therefore form a resist film that is resistant to cracking. Further, because the composition also contains the photosensitive substance (III) and the specified compound (IV), the resolution of the resist film is improved.

In contrast, in the photosensitive resin composition of Patent Document 1, the vinyl-based polymer does not contain structural units formed from the specified monomer (b), and therefore the vinyl-based polymer is rigid and lacks flexibility, the solubility in the developing solution is unsatisfactory, and a resist film containing the vinyl-based polymer does not exhibit a satisfactory combination of resolution and suppression of resist film cracking.

<Pattern Formation Method>

The pattern formation method of the present invention is a method having the steps described below.

(A) A step of forming a resist film composed of the photosensitive resin composition on the surface of a substrate.

(B) A step of forming a latent image by exposing the resist film.

(C) A step of forming a resist pattern by subjecting the resist film with the latent image formed thereon to a developing treatment with an alkaline developing solution.

(D) A step of forming a desired pattern on the substrate surface by processing the portions from which the resist has been removed.

(Step (A))

When the resist solution described above is used, the resist solution is applied by a spinner or a coater or the like to the surface of the substrate on which the pattern is to be formed, and the resist solution is then dried to form a resist film on the substrate surface.

When the dry film described above is used, the dry film is laminated to the surface of the substrate on which the pattern is to be formed so that the substrate and the resist film make contact.

(Step (B))

Examples of the exposure method include an ultraviolet light exposure method and a visible light exposure method.

Examples of the method used for performing selective exposure include methods using a photomask and scanning exposure methods using a laser beam. When a photomask is used, either a contact exposure method or an off-contact exposure method can be used.

When the dry film described above is used, the resist film is exposed through the support film to form the latent image, and the support film is then detached.

(Step (C))

Examples of the developing solution include aqueous solutions of alkalis.

Examples of the alkali include inorganic alkalis (such as sodium hydroxide, potassium hydroxide, sodium carbonate, sodium silicate, sodium metasilicate and ammonia water), primary amines (such as ethylamine and n-propylamine), secondary amines (such as diethylamine and di-n-butylamine), tertiary amines (such as triethylamine and methyldiethylamine), alcoholamines (such as dimethylethanolamine and triethanolamine), quaternary ammonium salts (such as tetramethylammonium hydroxide, tetraethylammonium hydroxide and choline hydroxide), and cyclic amines (such as pyrrole and piperidine).

Suitable amounts of alcohols, surfactants and aromatic hydroxyl group-containing compounds and the like may be added to the aqueous solution of the alkali.

A 1% by mass aqueous solution of sodium carbonate is particularly preferred as the developing solution, as it enables the same steps as the circuit formation process for a typical printed circuit board to be used.

(Step (D))

Examples of the processing method include conventional etching and plating methods and the like.

<Printed Circuit Board>

The photosensitive resin composition of the present invention is useful as a resist in a circuit formation process for a COF, a multilayer printed circuit board formed by the build-up method, or lead-out wiring used in a touch panel sensor circuit or tablet terminal or the like.

A printed circuit board of the present invention is produced using the photosensitive resin composition of the present invention. Specifically, the printed circuit board has conductive wiring formed on a substrate (such as an insulating plate or sheet). By mounting electronic components on this type of printed circuit board, targeted functions can be imparted to the electronic circuits.

<Method for Producing Printed Circuit Board>

The method for producing a printed circuit board according to the present invention is a method that uses the photosensitive resin composition of the present invention. Specifically, the method of the present invention is a method in which a substrate for circuit formation on which a resist pattern has been formed by the pattern formation method of the present invention is subjected to etching or plating to form wiring, and electronic components are then mounted on the formed wiring circuit as required.

EXAMPLES

The present invention is described below in further detail using a series of examples.

The evaluation methods used in the examples are described below.

(Weight-Average Molecular Weight)

The weight-average molecular weight (Mw) of each of the vinyl-based polymers was measured using a GPC system manufactured by Tosoh Corporation.

The measurements used three series-connected Shodex GPC K-805L columns (product name) manufactured by Showa Denko K.K. as the separation column, used tetrahydrofuran (flow rate: 1.0 mL/minute) as the solvent, used a differential refractometer as the detector, used polystyrenes as the standard polymers, and were conducted under conditions including a measurement temperature of 40° C. and an injection volume of 0.1 mL.

(Evaluation of Surface State)

With reference to JIS K 5600-5-1: Testing methods for paints, bend test (cylindrical mandrel method), the dry film was bent around the outer periphery of a circular cylinder having a diameter of 2 mm, and the dry film was inspected visually for cracks and evaluated against the following criteria.

A: no cracks occurred
D: cracks were confirmed (Resolution)

The resist film was exposed using an ultra high pressure mercury lamp so as to form a 10 μm line-and-space pattern, and following developing for 2 minutes in a 1% by mass aqueous solution of sodium carbonate (pH: about 11.6), the pattern shape was inspected using an electron microscope and evaluated against the following criteria.

AA: the exposed portions had dissolved completely
A: slight residues remained at the pattern edges
C: slight residues remained in the exposed portions
D: significant residues remained in the exposed portions Production Example 1

A flask fitted with a nitrogen inlet, a stirrer, a condenser, a dropping funnel and a thermometer was charged with 40 parts by mass of MEK under a nitrogen atmosphere. The temperature was raised to 80° C. while the flask contents were stirred.

Subsequently, a dripping solution containing a mixture of the compounds listed below was added dropwise to the flask over a period of 6 hours using the dropping funnel, and the 80° C. temperature was then maintained for a further one hour.

40 mol % of the monomer (a2-1) represented by the above formula (7-1) (para-hydroxystyrene),
20 mol % of methacrylic acid,
15 mol % of methyl methacrylate,
10 mol % of styrene,
15 mol % of ethyl acrylate,
7 parts by mass of a polymerization initiator (2,2'-azobis-2-methylbutyronitrile, manufactured by Otsuka Chemical Co., Ltd.) per 100 parts by mass of the combined total of all the above monomers, and
100 parts by mass of MEK.

Subsequently, another dripping solution containing a mixture of 10 parts by mass of MEK and 1 part by mass of 2,2'-azobis-2-methylbutyronitrile was added dropwise to the solution in the flask over a period of 60 minutes. The temperature of the solution inside the flask was then maintained at 80° C. for 3 hours, yielding a solution of a vinyl-based copolymer (I-1).

Production Examples 2 and 3

With the exception of altering the amounts added of the monomers to the amounts shown in Table 1, a solution of a vinyl-based copolymer (I-2) and a solution of a vinyl-based copolymer (I-3) were obtained using the same operations as those described for Production Example 1.

Production Example 4

A flask fitted with a nitrogen inlet, a stirrer, a condenser, a dropping funnel and a thermometer was charged with 50 parts by mass of MEK under a nitrogen atmosphere. The temperature was raised to 85° C. while the flask contents were stirred.

Subsequently, a dripping solution containing a mixture of the compounds listed below was added dropwise to the flask over a period of 4 hours using the dropping funnel, and the 85° C. temperature was then maintained for a further one hour.

11.5 mol % of 2-methoxyethyl acrylate,
16.8 mol % of methacrylic acid,
2.7 mol % of methyl methacrylate,
17 mol % of styrene,
43.1 mol % of ethyl acrylate,
8.9 mol % of 2-ethylhexyl acrylate, and
0.6 parts by mass of a polymerization initiator (2,2'-azobis-2-methylbutyronitrile, manufactured by Otsuka Chemical Co., Ltd.) per 100 parts by mass of the combined total of all the above monomers.

Subsequently, another dripping solution containing a mixture of 20 parts by mass of MEK and 1 part by mass of 2,2'-azobis-2-methylbutyronitrile was added dropwise to the solution in the flask over a period of 60 minutes. The temperature of the solution inside the flask was maintained at 85° C. for 2 hours, and the temperature was then cooled to room temperature. Subsequently, 30 parts by mass of MEK was added to the solution in the flask, yielding a solution of a vinyl-based copolymer (II-1).

Production Example 5

With the exceptions of altering the amount of MEK initially added to the flask to 45 parts by mass, altering the amount added of the polymerization initiator to 0.2 parts by mass per 100 parts by mass of the combined total of all the monomers, and altering the amount of MEK added after reducing the temperature to room temperature to 70 parts by mass, a solution of a vinyl-based copolymer (II-2) was obtained using the same operations as those described for Production Example 4.

Production Example 6

With the exception of altering the amount added of the polymerization initiator to 3 parts by mass per 100 parts by mass of the combined total of all the monomers, a solution of a vinyl-based copolymer (II-3) was obtained using the same operations as those described for Production Example 4.

Production Example 7

With the exception of altering the amounts added of the monomers to the amounts shown in Table 1, a solution of a vinyl-based copolymer (II-4) was obtained using the same operations as those described for Production Example 4.

TABLE 1

| Production Example | Vinyl-based copolymer | Monomer (mol %) | | | | | | | | Mw |
|---|---|---|---|---|---|---|---|---|---|---|
| | | (a) | | (b) | (c) | other than (a), (b) and (c) | | | | |
| | | (a1-1) | (a2-1) | 2-MTA | MAA | MMA | St | EA | 2-EHA | |
| 1 | (I-1) | — | 40 | — | 20 | 15 | 10 | 15 | — | 8,500 |
| 2 | (I-2) | — | 100 | — | — | — | — | — | — | 7,000 |
| 3 | (I-3) | 40 | — | — | 20 | 15 | 10 | 15 | — | 9,000 |
| 4 | (II-1) | — | — | 11.5 | 16.8 | 2.7 | 17 | 43.1 | 8.9 | 60,000 |
| 5 | (II-2) | — | — | 11.5 | 16.8 | 2.7 | 17 | 43.1 | 8.9 | 115,000 |
| 6 | (II-3) | — | — | 11.5 | 16.8 | 2.7 | 17 | 43.1 | 8.9 | 16,000 |
| 7 | (II-4) | — | — | — | 20 | 46 | 15 | 19 | — | 60,000 |

In the table, the monomer (a1-1) is the monomer represented by the above formula (6-1) (manufactured by Osaka Organic Chemical Industry Ltd.), the monomer (a2-1) is the monomer represented by the above formula (7-1) (para-hydroxystyrene), 2-MTA is 2-methoxyethyl acrylate, MAA is methacrylic acid, MMA is methyl methacrylate, St is styrene, EA is ethyl acrylate, and 2-EHA is 2-ethylhexyl acrylate.

(Compound (IV) Synthesis Examples)

Synthesis of compound represented by formula (2-1):

A mixture containing 16.8 parts by mass of 4-hydroxymandelic acid, 37.6 parts by mass of phenol and 170 parts by mass of 10% hydrochloric acid was reacted at 60 to 65° C. for two hours. Following completion of the reaction, a mixture containing 300 parts by mass of ion-exchanged water and 300 parts by mass of acetone was added to the reaction mixture, and a phase separation was performed at 60° C. The thus obtained organic layer was washed with ion-exchanged water. Following washing, the organic layer was concentrated under reduced pressure conditions, a mixture containing 5 parts by mass of acetone and 80 parts by mass of toluene was added to the thus obtained concentrated residue, and a recrystallization was performed to obtain a specified compound (IV) represented by the above formula (2-1). $^1$H-NMR and IR confirmed that the target compound had been obtained.

Synthesis of Compound Represented by Formula (2-2):

A mixture containing 94 parts by mass of phenol, 58 parts by mass of levulinic acid, 45 parts by mass of water and 180 parts by mass of concentrated sulfuric acid was reacted at 20° C. for 20 hours. Following completion of the reaction, a mixture containing 300 parts by mass of ion-exchanged water and 300 parts by mass of ethyl acetate was added to the reaction mixture, and a phase separation was performed. An aqueous solution of sodium bicarbonate was added to the thus obtained organic layer, and the organic layer was extracted. The thus obtained bicarbonate salt extract was acidified, extracted into ether, and then dried under vacuum, yielding a specified compound (IV) represented by the above formula (2-2). $^1$H-NMR and IR confirmed that the target compound had been obtained.

Example 1

A resist solution was obtained by mixing 70 parts by mass of the solution of the vinyl-based copolymer (I-1), 30 parts by mass of the solution of the vinyl-based copolymer (II-1), 10 parts by mass of the ester of the compound represented by the above formula (3) (1 mol) and 1,2-naphthoquinone-diazide-5-sulfonic acid (3 mol) as the photosensitive substance (III), 2 parts by mass of the compound represented by the above formula (2-1) as the specified compound (IV), and 200 parts by mass of MEK.

The resist solution was applied to the surface of a PET film having a thickness of 16 μm in an amount sufficient to produce a dried thickness of 5 μm, and the resist solution was then dried to form a dry film, which was subjected to the dry film evaluations described above. The results are shown in Table 3.

Examples 2 to 9, Comparative Example 1

With the exceptions of altering the type and amount of the vinyl-based (co)polymer (I), the type and amount of the vinyl-based copolymer (II), the type of the photosensitive substance (III), and the type of the specified compound (IV) as shown in Table 2, dry films were obtained in the same manner as described for Example 1, and were then subjected to the dry film evaluations described above. The results are shown in Table 3.

TABLE 2

| | Vinyl-based (co)polymer (I)/other | | Vinyl-based copolymer (II) | | Photosensitive substance (III) | | Compound (IV) | | MEK |
|---|---|---|---|---|---|---|---|---|---|
| | type | parts by mass | type | parts by mass | type | parts by mass | type | parts by mass | parts by mass |
| Example 1 | (I-1) | 70 | (II-1) | 30 | (III-1) | 10 | (2-1) | 2 | 200 |
| Example 2 | (I-1) | 70 | (II-2) | 30 | (III-1) | 10 | (2-1) | 2 | 200 |
| Example 3 | (I-1) | 70 | (II-3) | 30 | (III-1) | 10 | (2-1) | 2 | 200 |
| Comparative Example 1 | (I-1) | 70 | (II-4) | 30 | (III-1) | 10 | (2-1) | 2 | 200 |
| Example 4 | (I-2) | 70 | (II-1) | 30 | (III-1) | 10 | (2-1) | 2 | 200 |
| Example 5 | (I-3) | 70 | (II-1) | 30 | (III-1) | 10 | (2-1) | 2 | 200 |
| Example 6 | (I-1) | 70 | (II-1) | 30 | (III-2) | 10 | (2-1) | 2 | 200 |
| Example 7 | (I-1) | 70 | (II-1) | 30 | (III-3) | 10 | (2-1) | 2 | 200 |
| Example 8 | (I-1) | 70 | (II-1) | 30 | (III-4) | 10 | (2-1) | 2 | 200 |
| Example 9 | (I-1) | 70 | (II-1) | 30 | (III-1) | 10 | (2-2) | 2 | 200 |

In the table, (III-1) is the ester of the compound represented by the above formula (3) (1 mol) and 1,2-naphthoquinonediazide-5-sulfonic acid (3 mol), (III-2) is the ester of the compound represented by the above formula (4) (1 mol) and 1,2-naphthoquinonediazide-5-sulfonic acid (2 mol), (III-3) is the ester of the compound represented by the above formula (5) (1 mol) and 1,2-naphthoquinonediazide-5-sulfonic acid (3 mol), and (III-4) is the ester of the compound represented by formula (9) shown below (1 mol) and 1,2-naphthoquinonediazide-5-sulfonic acid (2 mol).

[Chemical Formula 12]

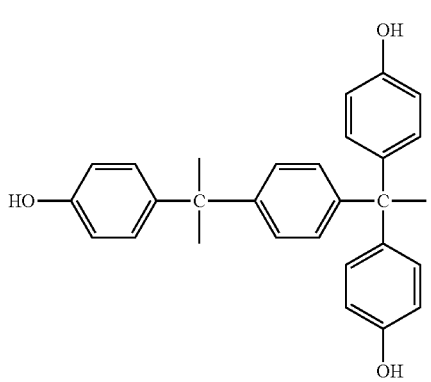

(9)

TABLE 3

|  | Evaluation of surface state | Resolution |
| --- | --- | --- |
| Example 1 | A | AA |
| Example 2 | A | A |
| Example 3 | A | A |
| Comparative Example 1 | D | C |
| Example 4 | A | A |
| Example 5 | A | AA |
| Example 6 | A | AA |
| Example 7 | A | AA |
| Example 8 | A | AA |
| Example 9 | A | AA |

The results of the evaluations revealed that each of the examples exhibited favorable cracking resistance and resolution. In particular, the examples which used a vinyl-based (co)polymer (I) containing the monomer (c) as a raw material and a vinyl-based copolymer (II) with a weight-average molecular weight of 60,000 exhibited extremely superior resolution. Comparative Example 1 did not contain the monomer (b) as a raw material for the vinyl-based copolymer (II), and therefore the cracking resistance was poor and the resolution was also unsatisfactory.

INDUSTRIAL APPLICABILITY

The photosensitive resin composition of the present invention is useful as a resist in a circuit formation process for a chip-on-film (COF), a multilayer printed circuit board formed by the build-up method, or lead-out wiring used in a touch panel sensor circuit or tablet terminal or the like, and is therefore extremely useful industrially.

The invention claimed is:
1. A photosensitive resin composition comprising:
   a vinyl-based (co)polymer (I) obtained by polymerizing a monomer mixture (a) comprising a vinyl-based monomer (a) having a phenolic hydroxyl group and a carboxyl group-containing vinyl-based monomer (c),
   a vinyl-based copolymer (II) (excluding the vinyl-based (co)polymer (I)) having a weight-average molecular weight of 15,000 to 120,000, obtained by polymerizing a monomer mixture (β) comprising 2-methoxyethyl acrylate, 2-ethylhexyl acrylate, methyl methacrylate, styrene, methacrylic acid and ethyl acrylate,
   a photosensitive substance (III), and
   a compound (IV) represented by formula (2) shown below:

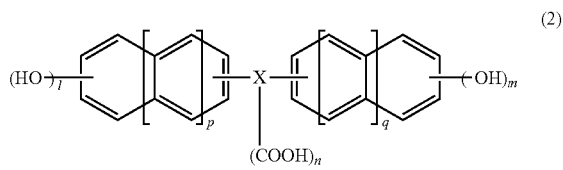

(2)

wherein X represents a hydrocarbon group having a carbon number of 1 to 6, each of l and m represents an integer of 1 to 3, n represents 1 or 2, and each of p and q represents 0 or 1.

2. The photosensitive resin composition according to claim 1, wherein a proportion of the 2-methoxyethyl acrylate in the monomer mixture (β) is from 5 to 30 mol %.

3. The photosensitive resin composition according to claim 1, wherein the photosensitive substance (III) is a quinonediazide compound.

4. The photosensitive resin composition according to claim 3, wherein the quinonediazide compound is an ester of an aromatic polyhydroxy compound having 1 to 3 aromatic rings, and 1,2-naphthoquinonediazide-5-sulfonic acid and/or 1,2-naphthoquinonediazide-4-sulfonic acid.

5. The photosensitive resin composition according to claim 4, wherein the quinonediazide compound is an ester of a compound represented by formula (3) shown below, a compound represented by formula (4) shown below or a compound represented by formula (5) shown below, and 1,2-naphthoquinonediazide-5-sulfonic acid and/or 1,2-naphthoquinonediazide-4-sulfonic acid:

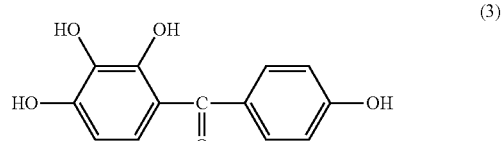

(3)

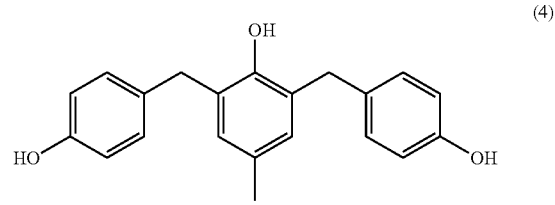

(4)

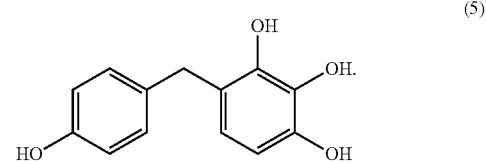

(5)

6. The photosensitive resin composition according to claim 1, wherein the compound (IV) is a compound represented by formula (2-1) shown below or a compound represented by formula (2-2) shown below:

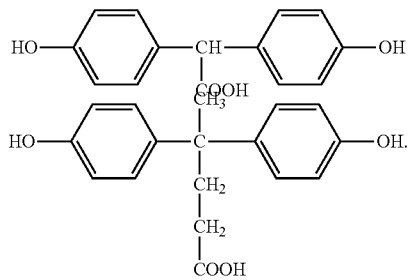

7. A photosensitive dry film, comprising a resist film formed from the photosensitive resin composition according to claim 1 formed on a surface of a support film.

8. A pattern formation method, comprising:
forming a resist film comprising the photosensitive resin composition according to claim 1 on a surface of a substrate;
forming a latent image by exposing the resist film; and
forming a resist pattern by subjecting the resist film with the latent image formed thereon to a developing treatment with an alkaline developing solution.

9. A method for producing a printed circuit board, comprising:
forming a resist film comprising the photosensitive resin composition according to claim 1 on a surface of a substrate;
forming a latent image by exposing the resist film;
forming a resist pattern by subjecting the resist film with the latent image formed thereon to a developing treatment with an alkaline developing solution; and
etching or plating the substrate to form wiring.

* * * * *